(12) United States Patent
Tsai et al.

(10) Patent No.: US 10,277,186 B2
(45) Date of Patent: Apr. 30, 2019

(54) CALIBRATION METHOD AND COMPUTER READABLE RECORDING MEDIUM

(71) Applicant: ASUSTek COMPUTER INC., Taipei (TW)

(72) Inventors: Pei-Chun Tsai, Taipei (TW); Kuo-Feng Liao, Taipei (TW); Wei-Po Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/881,998

(22) Filed: Jan. 29, 2018

(65) Prior Publication Data

US 2018/0234067 A1 Aug. 16, 2018

(30) Foreign Application Priority Data

Feb. 10, 2017 (TW) .............................. 106104502 A

(51) Int. Cl.
*H03G 3/32* (2006.01)
*G06F 3/16* (2006.01)
(Continued)

(52) U.S. Cl.
CPC .............. *H03G 3/32* (2013.01); *G06F 3/165* (2013.01); *G11B 20/10527* (2013.01);
(Continued)

(58) Field of Classification Search
CPC . H03G 3/32; H03G 3/04; G06F 3/165; G11B 20/10527; G11B 2020/10546;
(Continued)

(56) References Cited

U.S. PATENT DOCUMENTS 5,811,681 A * 9/1998 Braun .................... A61B 5/121
  600/559
7,019,205 B1 * 3/2006 Fujisawa ................. A63F 13/10
  84/609

(Continued)

FOREIGN PATENT DOCUMENTS

CN 105163221 A 12/2015
CN 105228050 A 1/2016
(Continued)

OTHER PUBLICATIONS

English machine translation of CN105228050 (Liang, Method and Device for Adjusting Tone Quality of Earphone on Terminal, published Jan. 2016).*

*Primary Examiner* — Mark Fischer
(74) *Attorney, Agent, or Firm* — McClure, Qualey & Rodack, LLP

(57) ABSTRACT

A calibration method and a computer readable recording medium are provided. The calibration method is applied to an electronic device of an electronic system. The electronic system includes the electronic device and a broadcasting device. The calibration method comprises: obtaining device information of the broadcasting device to determine a type of the broadcasting device; providing a user interaction interface, and obtaining an interactive operation via the user interaction interface; generating a calibration command corresponding to the broadcasting device according to the interactive operation; and calibrating a broadcasting setting of the broadcasting device according to the calibration command.

10 Claims, 3 Drawing Sheets

(51) Int. Cl.
*G11B 20/10* (2006.01)
*H04R 3/00* (2006.01)
*H04B 1/401* (2015.01)
*H04H 40/36* (2008.01)
*H03G 3/04* (2006.01)
*H04R 1/10* (2006.01)
*H04R 29/00* (2006.01)

(52) U.S. Cl.
CPC ............... *H03G 3/04* (2013.01); *H04B 1/401* (2013.01); *H04H 40/36* (2013.01); *H04R 3/00* (2013.01); *G11B 2020/10546* (2013.01); *H04R 1/1041* (2013.01); *H04R 29/001* (2013.01); *H04R 2430/01* (2013.01); *H04R 2499/11* (2013.01)

(58) Field of Classification Search
CPC .......... H04B 1/401; H04B 1/36; H04H 40/36; H04R 3/00; H04R 2430/01; H04R 29/001; H04R 2499/11
See application file for complete search history.

(56) References Cited

U.S. PATENT DOCUMENTS

| | | | |
|---|---|---|---|
| 9,949,009 B2* | 4/2018 | McCarthy | H04R 1/1016 |
| 2007/0222516 A1* | 9/2007 | Seaberg | H03F 3/45192 |
| | | | 330/257 |
| 2013/0089208 A1* | 4/2013 | Fairey | H04R 5/04 |
| | | | 381/17 |
| 2015/0370404 A1 | 12/2015 | Hu et al. | |

FOREIGN PATENT DOCUMENTS

| | | |
|---|---|---|
| CN | 105302292 A | 2/2016 |
| CN | 105782897 A | 8/2016 |
| CN | 105872897 A | 8/2016 |

* cited by examiner

CALIBRATION METHOD AND COMPUTER READABLE RECORDING MEDIUM

CROSS-REFERENCE TO RELATED APPLICATION

This application claims the priority benefit of TW application serial No. 106104502, filed on Feb. 10, 2017. The entirety of the above-mentioned patent application is hereby incorporated by references herein and made a part of specification.

BACKGROUND OF THE INVENTION

Field of the Invention

The disclosure relates to a calibration method and more specifically, relates to an audio stage calibration method.

Description of the Related Art

With a rapid development of an electronic industry and information technology, electronic devices become popular. Functions of electronic device are diverse. For example, a computer or a telephone has a function for connecting to an earphone of different brands or types.

Earphones with different brands or types have different audio effects. Even earphones of a same type have different audio quality due to differences in a factory assembly. However, conventionally, an audio quality setting for different earphones is the same without considering the difference between the earphones. In addition, users have different requirements on audio quality. As a result, users always have different feelings on the audio quality of the different earphones.

BRIEF SUMMARY OF THE INVENTION

According to a first aspect, a calibration method is provided. The calibration method is applied to an electronic device of an electronic system, the electronic system includes the electronic device and a broadcasting device, the calibration method comprising: obtaining device information of the broadcasting device to determine a type of the broadcasting device; obtaining an interactive operation via the user interaction interface on the electronic device; generating a calibration command corresponding to the broadcasting device according to the interactive operation; and adjusting a broadcasting setting of the broadcasting device according to the calibration command.

According to a second aspect, a computer readable recording medium is provided. The computer readable recording medium stores a computer program to make an electronic device to execute a calibration method, wherein the calibration method comprising: obtaining device information of the broadcasting device to determine a type of the broadcasting device; obtaining an interactive operation via an user interaction interface; generating a calibration command corresponding to the broadcasting device according to the interactive operation; and adjusting a broadcasting setting of the broadcasting device according to the calibration command.

These and other features, aspects and advantages of the present invention will become better understood with regard to the following description, appended claims, and accompanying drawings.

DETAILED DESCRIPTION OF THE EMBODIMENTS

These and other features, aspects, and advantages of the disclosure will become better understood with regard to the following description and accompanying drawings. The same or similar numbers denote the same or similar components or steps. In the other aspect, some common components and steps are not illustrated in the embodiment to avoid unnecessary limitations.

The term "electrically connected" represents that one component is electrically connected to the other component via another component, or one component is electrically connected to the other component directly.

Unless specifically noted, the terms "one" and "the" are referred as one or more.

In an embodiment, an electronic device is applied to an audio stage calibration for a broadcasting device. A structure of the electronic device is illustrated by referring to FIG. 1.

Figure 1:
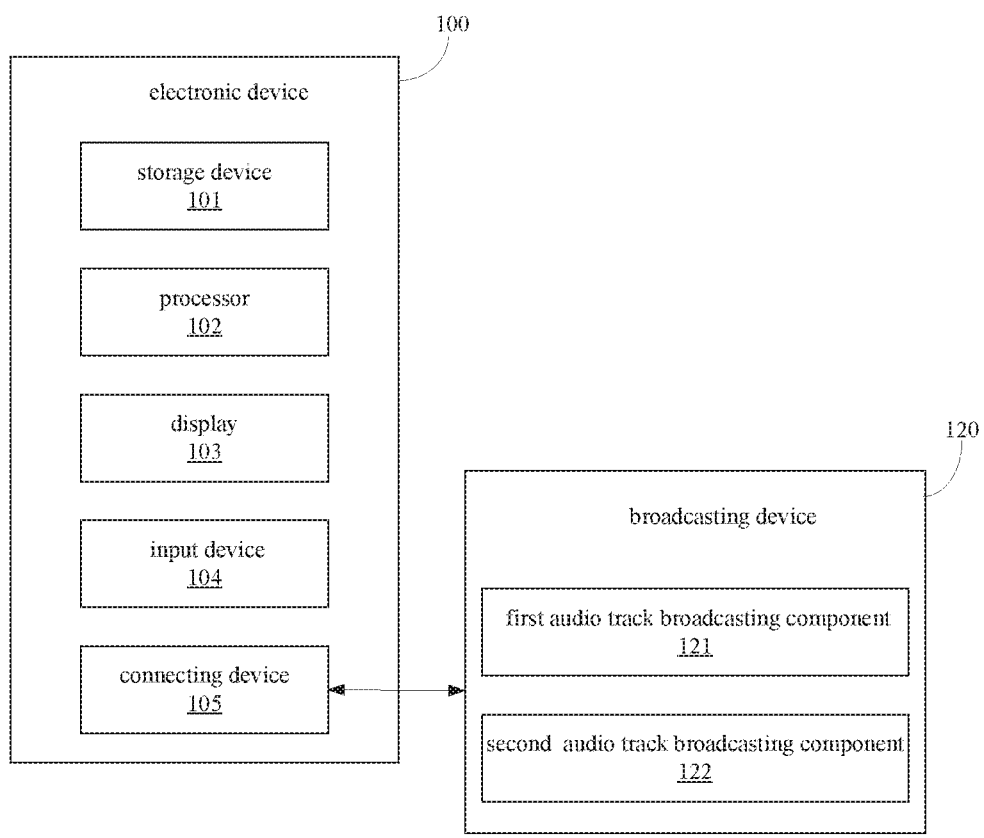
FIG. 1 is a block diagram showing an electronic system in an embodiment.

Please refer to FIG. 1. FIG. 1 is a block diagram showing an electronic system 10 in an embodiment. As shown in FIG. 1, in an embodiment, an electronic system 10 includes an electronic device 100 and a broadcasting device 120. The electronic device 100 is electrically connected to the broadcasting device 120. In an embodiment, the electronic device 100 is a smart telephone, a tablet computer, a notebook computer, a desktop computer. The broadcasting device 120 is an earphone, an audio player built-in a head-mounted stereo virtual display, an audio device, a speaker, a telephone receiver, which is not limited herein.

In FIG. 1, the electronic device 100 includes a storage device 101, a processor 102, a display 103, an input device 104 and a connecting device 105. The processor 102 is electrically connected to the storage device 101, the display 103, the input device 104 and the connecting device 105.

In an embodiment, the storage device 101 is a hard disk, a flash memory or another recording medium. The processor 102 is a central processing unit or a microcontroller. The display 103 is a liquid crystal display, a cathode ray tube display, or an electronic paper display. The input device 104 is a touch device, a keyboard, or a trackball. In an embodiment, the display 103 and the input device 104 are integrated into a touch screen or independent devices, respectively. The connecting device 105 is a 3.5 mm audio source hole, a 2.5 mm audio source hole, a USB port or a high definition multimedia (HDMI) port.

In an embodiment, a computer program stored in the storage device 101 is preset to be executed by the processor 102 when the connecting device 105 is electrically connected to the broadcasting device 120. Then, device information (such as, a brand and a type) of the broadcasting device 120 is read automatically via the computer program to determine a type of the broadcasting device 120. An audio is played by the broadcasting device 120. A user interaction interface is displayed on the display 103 of the electronic device 100. An interactive operation related to play audio is received by the input device 104. Then, a calibration command of the broadcasting device 120 is generated by the processor 102 according to the interactive operation. The calibration command corresponding to the broadcasting device 120 is stored in the storage device 101.

As a result, when the connecting device 105 is electrically connected to the broadcasting device 120 again, the processor 102 automatically accesses the calibration command which is corresponding to the broadcasting device 120 and pre-stored in the storage device 101. Then, a broadcasting setting of the broadcasting device 120 is adjusted automatically by the processor 102 according to the calibration command. In this way, a better immersive audio effect is generated via the broadcasting device 120.

Figure 2:
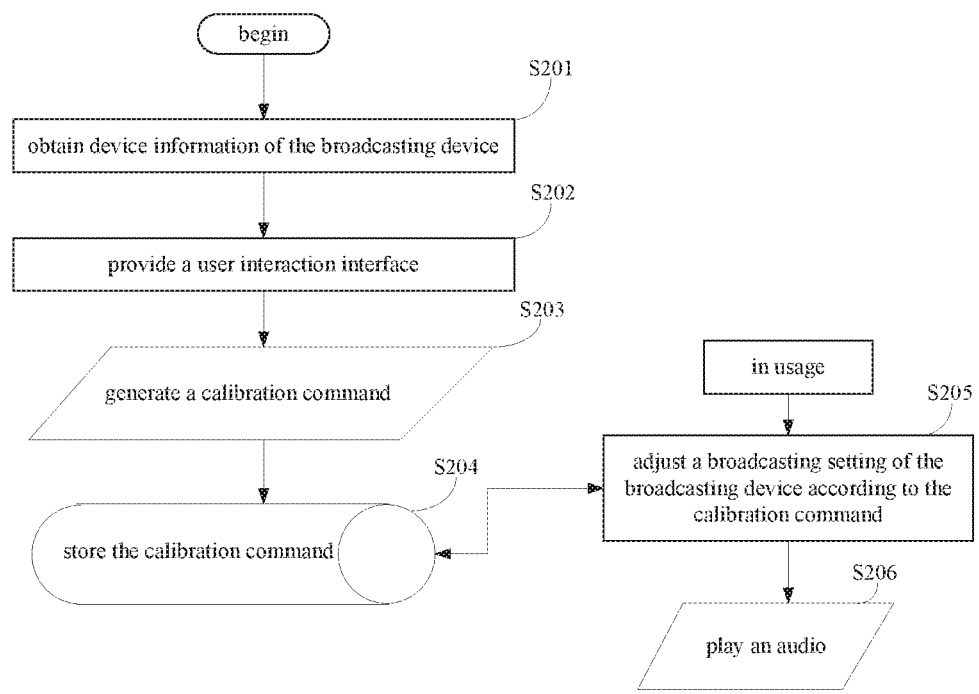
FIG. 2 is a flow chart showing a calibration method in an embodiment.

The calibration method 200 executed by the electronic device 100 applied in the electronic system 10 is further illustrated hereinafter. Please refer to FIG. 1 and FIG. 2. FIG. 2 is a flow chart showing a calibration method 200 in an embodiment. In an embodiment, the calibration method 200 is a computer program stored in a computer readable recording medium. The electronic device 100 executes the calibration method 200 after the recording medium is read. As shown in FIG. 2, the calibration method 200 includes the steps S201 to S206. The order of the steps described herein is adjustable according to practical requirements. Unless specifically stated, some steps can be executed simultaneously. The hardware devices for implementing the steps are stated in the above embodiments, which are not repeated herein.

When the electronic device 100 is electrically connected to the broadcasting device 120, in the step S201, device information of the broadcasting device 120 is obtained to determine a type of the broadcasting device 120. In the step S202, a user interaction interface is provided to receive an interactive operation corresponding to the broadcasting device 120. In the step S203, a calibration command corresponding to the broadcasting device 120 is generated according to the interactive operation. In the step S204, the calibration command corresponding to the broadcasting device 120 is stored. As a result, a customized calibration command is automatically generated via the electronic device 100 in an interactive process without a manual adjustment. Then, when the electronic device 100 is electrically connected to the broadcasting device 120 again, in the step S205, a broadcasting setting of the broadcasting device 120 is adjusted according to the calibration command. In the step S206, audio is played by the broadcasting device 120 according to the broadcasting setting. Then, a better immersive audio effect is generated.

In an embodiment, the broadcasting device 120 includes a first audio track broadcasting component 121 and a second audio track broadcasting component 122. The first audio track broadcasting component 121 corresponds to a left audio track. The second audio track broadcasting component 122 corresponds to a right audio track. The number of the audio track of the broadcasting device 120 is not limited herein. In other embodiments, the broadcasting device 120 includes a plurality of audio track broadcasting components to play at multiple tracks (such as, a 5.1 audio track and a 7.1 audio track). In the step S202, a gain value of a volume of the left and the right audio tracks is adjusted. When the first audio track broadcasting component 121 and the second audio track broadcasting component 122 play audio respectively, the interactive operation represents a volume relationship between the first audio track broadcasting component 121 and the second audio track broadcasting component 122. When the volume relationship represents that the volumes of the first audio track broadcasting component 121 is different from the second audio track broadcasting component 122, the volume of the first audio track broadcasting component 121 or that of the second audio track broadcasting component 122 is adjusted.

Figure 3:
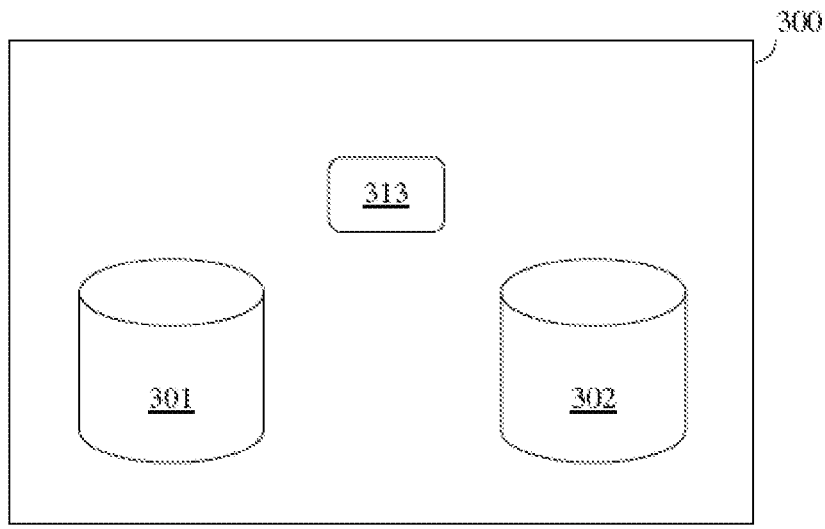
FIG. 3 is a schematic diagram showing a user interaction interface in an embodiment.

The volume relationship is further illustrated with referring to FIG. 1, FIG. 2 and FIG. 3. FIG. 3 is a schematic diagram showing a user interaction interface 300 in an embodiment. As shown in FIG. 3, in an embodiment, a first object 301, a second object 302 and a same level volume option 313 are displayed on the user interaction interface 300. In an embodiment, the first object 301 represents the first audio track broadcasting component 121. The second object 302 represents the second audio track broadcasting component 122. The first audio track broadcasting component 121 and the second audio track broadcasting component 122 play audios respectively (for example, the volumes of the first audio track broadcasting component 121 and the second audio track broadcasting component 122 are preset to be the same). When a user feels that the volumes of the first audio track broadcasting component 121 and the second audio track broadcasting component 122 are the same, the same level volume option 313 is selected via the interactive operation. When the user feels that the volume of the first audio track broadcasting component 121 is louder, the first object 301 is selected via the interactive operation. When the user feels that the volume of the second audio track broadcasting component 122 is louder, the second object 302 is selected via the interactive operation. When the interactive operation represents that the volume of the first audio track broadcasting component 121 is different from the volume of the second audio track broadcasting component 122, the calibration command is generated in the step S203.

In an embodiment, in the step S202, in a first round, the first audio track broadcasting component 121 and the second audio track broadcasting component 122 play audio of a same volume. However, when the interactive operation represents that the volume of the first audio track broadcasting component 121 is different from the volume of the second audio track broadcasting component 122 (for example, the volume of the first audio track broadcasting component 121 is louder than that of the second audio track broadcasting component 122), the calibration command is executed to decrease the volume of the first audio track broadcasting component 121 by a first volume. In a second round, the first audio track broadcasting component 121 and the second audio track broadcasting component 122 play audio of a same volume again. When the subsequent interactive operation still represents that the volume of the first audio track broadcasting component 121 is louder than that of the second audio track broadcasting component 122, the calibration command is executed to decrease the volume of the first audio track broadcasting component 121 by a second volume. In an embodiment, a level of the second volume (such as, 8 dB) is higher than that of the first volume (such as, 5 dB). Therefore, a volume setting suitable for the user is obtained quickly in a limited rounds by a way of decreasing the volume each time. In other embodiment, when the subsequent interactive operation represents that the volume of the first audio track broadcasting component 121 is lower than that of the second audio track broadcasting component 122, the calibration command is executed to increase the volume of the first audio track broadcasting component 121 by a third volume. In an embodiment, the third volume (such as, 2 dB) is lower than that of the first volume (such as, 5 dB). A volume setting suitable for the user is obtained quickly in a limited rounds by adjusting the volume non-linearly. The above calibration process is repeated for a few rounds (such as, five rounds) until the same level volume option 313 is selected. In an embodiment, the upper and the lower limits of the number of the rounds are set automatically via a computer program.

In an embodiment, when the same level volume option 313 is selected, the above process is still executed repeatedly for a few rounds (such as, two rounds) that is set via a computer program to confirm the selection of the user.

In an embodiment, in the step S202, an audio latency of the left audio track and that of the right audio track is adjusted. In an embodiment, when the first audio track broadcasting component 121 and the second audio track broadcasting component 122 play audio, respectively, the interactive operation represents an audio latency relationship between the first audio track broadcasting component 121 and the second audio track broadcasting component 122. When the interactive operation represents that the audio latency of the first audio track broadcasting component 121 and the audio latency of the second audio track broadcasting component 122 are asynchronous, the audio latency of the first audio track broadcasting component 121 or the audio latency of the second audio track broadcasting component 122 is adjusted.

Figure 4:
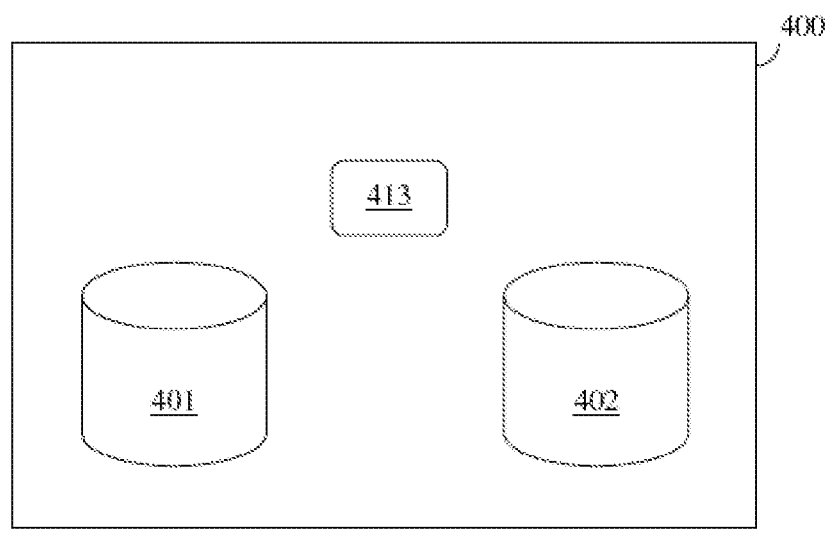
FIG. 4 is a schematic diagram showing a user interaction interface in an embodiment.

Please refer to FIG. 1, FIG. 2 and FIG. 4. As shown in FIG. 4, in an embodiment, a first object 401, a second object 402 and an audio sync option 413 are displayed on the user interaction interface 400. In an embodiment, the first object 401 represents the first audio track broadcasting component 121 (such as, a left audio track). The second object 402 represents the second audio track broadcasting component 122 (such as, a right audio track). The first audio track broadcasting component 121 and the second audio track broadcasting component 122 play audio, respectively. For example, the audios of the first audio track broadcasting component 121 and the second audio track broadcasting component 122 are preset to be synchronous, or the audio of the left audio track or that of the right audio track is played with latency (such as, 30 ms delay). In the embodiment, when the user feels that the audios played via the first audio track broadcasting component 121 and the second audio track broadcasting component 122 are synchronous, the interactive operation is executed to select the audio sync option 413. When the user feels that the audio from the first audio track broadcasting component 121 is played later than the audio from the second audio track broadcasting component 122, the first object 401 is selected via the interactive operation. When the user feels that the audio from the second audio track broadcasting component 122 is played later than the audio from the first audio track broadcasting component 121, the second object 402 is selected via the interactive operation. When the interactive operation represents that the audio played via the first audio track broadcasting component 121 and the audio played via the second audio track broadcasting component 122 are asynchronous, the calibration command is generated in the step S203.

In the step S202, in the first round, when the interactive operation represents that the an audio from the first audio track broadcasting component 121 and the audio from the second audio track broadcasting component 122 are asynchronous (for example, the audio from the first audio track broadcasting component 121 is played later than the audio from the second audio track broadcasting component 122), the calibration command is executed to decrease the audio latency of the first audio track broadcasting component 121 by a first buffer to set the next play. In the second round, the first audio track broadcasting component 121 and the second audio track broadcasting component 122 play audio again. When the subsequent interactive operation still represents that the audio from the first audio track broadcasting component 121 is played later than the audio from the second audio track broadcasting component 122, the calibration command is executed to decrease the audio latency of the first audio track broadcasting component 121 by a second buffer to set the next play. In an embodiment, the second buffer is longer than the first buffer. An audio track sync setting suitable for the user is obtained quickly in a limited rounds by gradually decreasing the audio latency of the volume each time. When the subsequent interactive operation represents that the audio from the first audio track broadcasting component 121 is played later than the audio from the second audio track broadcasting component 122, the calibration command is executed to increase the audio latency of the first audio track broadcasting component 121 by a third buffer to set the next play. In an embodiment, the third buffer is shorter than the first buffer. An audio track sync setting suitable for the user is obtained quickly in a limited rounds by adjusting the audio latency non-linearly. The above calibration process is repeated for a few rounds (such as, five rounds) until the audio sync option 413 is selected. In an embodiment, an upper limit of the delay interval between the left audio track and the right audio track is set automatically via a computer program.

In an embodiment, in the step S203, a dynamic range compressor is executed on the volume. The dynamic range compressor adjusts a maximum gain and a minimum gain of the volume of the whole audio stage performance. Due to different impedances of the broadcasting devices 120, different physiological conditions of different users (especially, for a normal hearing user or a user with slight hearing impairment) and differences in the production of the broadcasting devices 120, the users have different feelings of the audio played via the broadcasting devices 120. With the above calibration in the step S203, the customized maximum gain, the customized minimum gain and a middle change are obtained. In an embodiment, an interactive calibration is executed under an environment with a background noise. Then, a best performance of the audio stage in the environment is obtained. For example, the audio effect of a small volume in a game or a movie would not be ignored due to the difference of the environments and hardware of the broadcasting devices. As a result, the creation intention of games or movies is kept.

In an embodiment, a preset volume range of the electronic device 100 is a first volume range (such as 0~100 units). The volume within the first volume range can be selected manually at a user interface (such as, a volume adjustment interface) displayed on the electronic device 100. The volume playable by the hardware of the broadcasting device 120 is a second volume range (such as −50~150 units). In an embodiment, a maximum gain of the second volume range (such as 150 units) is greater than that of the first volume range (such as 100 units), and a minimum gain of the second volume range (such as −50 units) is less than that of the first volume range (such as 0 unit). A customized third volume range (such as, −10~80 unit) can be obtained via a computer program executed by the electronic device 100. Both the third volume range and the first volume range are involved in the second volume range. In an embodiment, the third volume range can be set out of the preset first volume range. After the above calibration process, 0~100 volume levels (units) are still shown at the user interface (such as, a volume adjustment interface) of the electronic device 100. However, after the above calibration, when the volume on the user interface is turned to the maximum (such as 100 volume level), the volume output by the broadcasting device 120 is the maximum gain of the third volume range (80 units). When the volume on the user interface is turned to the minimum (such as 0 volume level), the volume output by the broadcasting device 120 is the minimum gain of the third volume range (−10 units). In an embodiment, the volume distribution between the maximum gain and the minimum gain of the third volume range is not average.

In the step S203, the audio is played with a volume (For example, number values are played in random, or the times of the audio played by the left and right audio tracks are different). When the interactive operation matches with a content of the audio, it represents that the user hears the content and makes a correct choice. Then, the volume of the audio is gradually decreased until the interactive operation does not match with the content. That is, the user cannot hear the content of the audio and makes a wrong choice. Then, the volume of the audio is gradually increased until the interactive operation marches with the content. That is, the user hears the content of the audio again. The above calibration is repeated several times (for example, three times) to generate the calibration command. In an embodiment, the calibration command is executed to determine a minimum gain of the customized volume. As a result, the minimum volume hearable by the user is determined.

In the step S203, the audio is played with a volume. The volume of the audio is increased each time until the interactive operation is executed to stop playing the audio. For example, when the user feels that the audio is too loud or too noisy, the interactive operation is executed to stop playing the audio. Then, the maximum gain of the customized volume is determined.

In the step S203, the middle value of the volume is calculated according to the customized minimum gain and the customized maximum gain of the volume, after the minimum gain and the maximum gain of the customized volume are determined. In an embodiment, the middle value of the volume is calculated according to a non-linear relationship. For example, the middle value of the volume is adjusted by referring to a predetermined curve or a physiological perception curve recorded in the above interactive process.

In an embodiment, parameters of the minimum gain and the maximum gain of the customized volume are limited by specifications of the operating system to protect the sense of the user. In an embodiment, the minimum gain and the maximum gain provided by the specification of the Microsoft is between −96 dB and +12 dB, which is not limited herein.

In conclusion, the calibration method in embodiments is adapted to any broadcasting device, and a better immersive audio effect is obtained.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A calibration method, applied to an electronic device of an electronic system, the electronic system includes the electronic device and a broadcasting device, the calibration method comprising:

obtaining device information of the broadcasting device to determine a type of the broadcasting device;

obtaining an interactive operation via a user interaction interface on the electronic device;

generating a calibration command corresponding to the broadcasting device according to the interactive operation; and adjusting a broadcasting setting of the broadcasting device according to the calibration command, wherein the step of generating the calibration command corresponding to the broadcasting device according to the interactive operation comprises:

playing an audio with a volume;

when the interactive operation matches a content of the audio, gradually decreasing the volume of the audio until the interactive operation does not consistently match the content of the audio, and gradually increasing the volume of the audio until the interactive operation consistently matches the content of the audio; and repeating the previous step to generate the calibration command, wherein the calibration command is executed to determine a minimum gain of a customized volume.

2. The calibration method according to claim 1, wherein the broadcasting device includes a first audio track broadcasting component and a second audio track broadcasting component.

3. The calibration method according to claim 2, wherein the step of generating the calibration command corresponding to the broadcasting device according to the interactive operation comprises:

generating the calibration command when the interactive operation represents that a volume of the first audio track broadcasting component is different from the volume of the second audio track broadcasting component.

4. The calibration method according to claim 3, further comprising:

reducing the volume of the first audio track broadcasting component by a first volume according to the calibration command when the interactive operation represents that the volume of the first audio track broadcasting component is louder than the volume of the second audio track broadcasting component;

reducing the volume of the first audio track broadcasting component by a second volume according to the calibration command when a subsequent interactive operation still represents that the volume of the first audio track broadcasting component is louder than the volume of the second audio track broadcasting component, wherein a value of the second volume is greater than the value of the first volume; and increasing the volume of the first audio track broadcasting component by a third volume according to the calibration command when a subsequent interactive operation represents that the volume of the first audio track broadcasting component is lower than the volume of the second audio track broadcasting component, wherein the value of the third volume is less than the value of the first volume.

5. The calibration method according to claim 2, wherein the step of generating the calibration command corresponding to the broadcasting device according to the interactive operation comprises:

generating the calibration command when the interactive operation represents that an audio played via the first audio track broadcasting component and an audio played via the second audio track broadcasting component are asynchronous.

6. The calibration method according to claim 5, further comprising:

decreasing an audio latency of the audio played via the first audio track broadcasting component by a first buffer according to the calibration command when the interactive operation represents that the audio from the first audio track broadcasting component is played later than the audio played from the second audio track broadcasting component, decreasing the audio latency of the first audio track broadcasting component according to a second buffer according to the calibration command when a subsequent interactive operation still represents that the audio from the first audio track broadcasting component is played later than the audio from the second audio track broadcasting component, wherein the second buffer is longer than the first buffer; and increasing the audio latency of the first audio track broadcasting component by a third buffer according to the calibration command when a subsequent interactive operation represents that the audio from the first audio track broadcasting component is played faster than the audio from the second audio track broadcasting component, wherein the third buffer is shorter than the first buffer.

7. The calibration method according to claim 1, wherein the step of generating the calibration command corresponding to the broadcasting device according to the interactive operation comprises:

playing an audio with a volume; and gradually increasing the volume of the audio until the interactive operation is executed to stop playing the audio to generate the calibration command;

wherein the calibration command is executed to determine a maximum gain of a customized volume.

8. The calibration method according to claim 7, further comprising:

calculating a middle value of the volume according to the minimum gain and the maximum gain of the customized volume after determining the minimum gain and the maximum gain of the customized volume.

9. A computer readable recording medium, storing a computer program to make an electronic device to execute a calibration method, wherein the calibration method comprises:

obtaining device information of the broadcasting device, wherein the broadcasting device includes a first audio track broadcasting component and a second audio track broadcasting component;

obtaining an interactive operation via an user interaction interface;

generating a calibration command corresponding to the broadcasting device according to the interactive operation, wherein the step of generating the calibration command corresponding to the broadcasting device according to the interactive operation comprises: generating the calibration command when the interactive operation represents that an audio played via the first audio track broadcasting component and an audio played via the second audio track broadcasting component are asynchronous;

adjusting a broadcasting setting of the broadcasting device according to the calibration command;

performing a first determination of whether the interactive operation represents that the audio from the first audio track broadcasting component is played later than the audio played from the second audio track broadcasting component, and in response to the first determination indicating that the interactive operation represents that the audio from the first audio track broadcasting component is played later than the audio played from the second audio track broadcasting component, performing an adjustment of decreasing an audio latency of the audio played via the first audio track broadcasting component by a first buffer;

performing a second determination of whether a first subsequent interactive operation represents that the audio from the first audio track broadcasting component is played later than the audio from the second audio track broadcasting component, and in response to the second determination indicating that the first subsequent interactive operation represents that the audio from the first audio track broadcasting component is played later than the audio from the second audio track broadcasting component, performing an adjustment of decreasing the audio latency of the first audio track broadcasting component according to a second buffer, wherein the second buffer is longer than the first buffer; and performing a third determination of whether a second subsequent interactive operation represents that the audio from the first audio track broadcasting component is played sooner than the audio from the second audio track broadcasting component, and in response to the third determination indicating that the second subsequent interactive operation represents that the audio from the first audio track broadcasting component is played sooner than the audio from the second audio track broadcasting component, performing an adjustment of increasing the audio latency of the first audio track broadcasting component by a third buffer, wherein the third buffer is shorter than the first buffer.

10. A calibration method, applied to an electronic device of an electronic system, the electronic system includes the electronic device and a broadcasting device, the calibration method comprising:

obtaining device information of the broadcasting device to determine a type of the broadcasting device, wherein the broadcasting device includes a first audio track broadcasting component and a second audio track broadcasting component;

obtaining an interactive operation via a user interaction interface on the electronic device;

generating a calibration command corresponding to the broadcasting device according to the interactive operation, wherein the step of generating the calibration command corresponding to the broadcasting device according to the interactive operation comprises: generating the calibration command when the interactive operation represents that a volume of the first audio track broadcasting component is different from the volume of the second audio track broadcasting component;

adjusting a broadcasting setting of the broadcasting device according to the calibration command;

performing a first determination of whether the interactive operation represents that the volume of the first audio track broadcasting component is louder than the volume of the second audio track broadcasting component, and in response to the first determination indicating that the interactive operation represents that the volume of the first audio track broadcasting component is louder than the volume of the second audio track broadcasting component, performing an adjustment of reducing the volume of the first audio track broadcasting component by a first volume;

performing a second determination of whether a first subsequent interactive operation represents that the volume of the first audio track broadcasting component is louder than the volume of the second audio track broadcasting component, and in response to the second determination indicating that the first subsequent interactive operation represents that the volume of the first audio track broadcasting component is louder than the volume of the second audio track broadcasting component, performing an adjustment of reducing the volume of the first audio track broadcasting component by a second volume, wherein a value of the second volume is greater than the value of the first volume; and performing a third determination of whether a second subsequent interactive operation represents that the volume of the first audio track broadcasting component is lower than the volume of the second audio track broadcasting component, and in response to the third determination indicating that the second subsequent interactive operation represents that the volume of the first audio track broadcasting component is lower than the volume of the second audio track broadcasting component, performing an adjustment of increasing the volume of the first audio track broadcasting component by a third volume, wherein the value of the third volume is less than the value of the first volume.

* * * * *